April 21, 1970 R. W. BOWER 3,507,709

METHOD OF IRRADIATING DIELECTRIC-COATED SEMICONDUCTOR BODIES WITH LOW ENERGY ELECTRONS

Filed Sept. 15, 1967

INVENTOR.
ROBERT W. BOWER,
BY
W. Allister Jr
ATTORNEY.

3,507,709
Patented Apr. 21, 1970

3,507,709

METHOD OF IRRADIATING DIELECTRIC-COATED SEMICONDUCTOR BODIES WITH LOW ENERGY ELECTRONS

Robert W. Bower, Palos Verdes, Calif., assignor to Hughes Aircraft Company, Culver City, Calif., a corporation of Delaware Filed Sept. 15, 1967, Ser. No. 668,111
Int. Cl. H01l 7/54
U.S. Cl. 148—1.5 10 Claims

ABSTRACT OF THE DISCLOSURE

Method of treating dielectric-coated semiconductor bodies by irradiation with low energy electrons to establish a negative potential on the dielectric coating so as to prevent positive charge build-up across the dielectric during ion implantation therethrough or to attract undesired positive ions in the dielectric to the electron irradiated surface where these positive ions may be rendered ineffective or removed.

This invention relates to semiconductor devices and apparatus and especially to such devices having protective insulating or dielectric coatings disposed on a surface of a semiconductor body. More particularly, the invention relates to methods for treating semiconductor bodies having insulating coatings thereon.

It is well-known to fabricate semiconductor devices and apparatuses by forming a coating of an oxide of semiconductor material on the semiconductor body and using such coating not only as a mask for fabricating the device but also as a permanent protective film which is left in situ to prevent contamination on other deleterious effects from the atmosphere. Hoerni in his U.S. Patent No. 3,025,589, for example, teaches the fabrication of a planar transistor by first forming a film of silicon oxide on a surface of a silicon body of a given conductivity type and then opening up a hole in the oxide film through which a conductivity-type-determining impurity is permitted to diffuse into the silicon body to form a base region. Thereafter this opening is again closed as by oxidation of the exposed silicon surface and a smaller hole opened up therein through which a different conductivity-type-determining impurity is caused to diffuse into the base region and to form an emitter region. The PN junctions between the collector-base and base-emitter regions actually lie beneath the oxide coating or mask which is permanently left in situ to protect these junctions.

In another type of device (called the metal-oxide-semiconductor field effect transistor and abbreviated to MOSFET) a gate member is formed on the surface of an insulator on a semiconductor body and over the channel region between source and drain regions formed in the semiconductor body. The gate, which is usually of metal, is electrically insulated from the underlying channel region of semiconductor material by an oxide layer which may be formed by oxidizing the surface of the semiconductor body. Operation of transistors of this type is based upon the control of the conductivity of the channel region between the source and drain regions by an electric field established by means of the insulated gate. In this type of device majority charge carriers (electrons or holes) flow from the "source" member or region through the channel region to a "drain" member or region. Since the conductivity of the channel region may be controlled by the field on the insulated gate member, modulation or control of this source-drain current may be readily achieved. The gate member is insulated from the semiconductor body in order to prevent charge carriers from flowing to or from it and to thus prevent the gate from acting as a source or drain. Such devices are known in the art and their structure and operation is amply described by Hofstein and Heiman in an article entitled "Silicon Insulated-Gate Field-Effect Transistor" published in the September 1962 Proceedings of the I.E.E.E. commencing at page 1190 thereof. Normally such field-effect transistors employ source and drain members constituted by spaced regions of like conductivity type disposed on the same surface of a semiconductor body of opposite conductivity type with the gate arranged over the space between the source and drain regions and, as mentioned previously, insulated therefrom. It will also be appreciated that such field-effect devices may be made by the aforementioned oxide masking and diffusion techniques.

In my copending application entitled "Field-Effect Device With Insulated Gate," S.N. 590,033, filed Oct. 27, 1966, and assigned to the instant assignee, a superior method for fabricating such a field-effect transistor is described. When oxide masking and diffusion techniques are employed to fabricate these devices the mask alignment problems are severe, particularly where the channel region over which the insulated gate must be positioned is small. This and other difficulties are avoided by the process described in my aforementioned copending application which permits the source and drain regions, which define the channel region, to be formed after the gate member is disposed on the semiconductor body by using the gate member as a mask to precisely establish the boundaries of the channel region. Briefly, this is achieved by providing an oxide insulating layer on the surface of the semiconductor body, forming the gate member where desired on this oxide layer, and then, using the gate as a mask, forming the source and drain regions by ion implanting the appropriate conductivity-type-determining impurities into the semiconductor body through the oxide layers adjacent the gate-mask. These impurities are thus implanted where desired and determine the conductivity type of the semiconductor regions implanted thereby.

It has been found that when this method of fabrication is used, severe and permanent damage to the protective dielectric layer often occurs due to the charging up of the dielectric surface by the positively charged ions impinging thereon which damage results in a low yield of useful devices. While a large percentage of the ions do penetrate the dielectric a sufficient number still builds up on the dielectric surface in time which apparently produces an electric field of sufficient strength resulting in dielectric breakdown or rupture. Since the metallic gate is of greater thickness than the range of the ions, meaning that the ions cannot penetrate through the gate, the charge build up on the gate is much more rapid as is the ensuing breakdown or rupture of the dielectric layer under the gate. This results in the gate becoming electrically shorted to the conduction channel regions thereunder.

Another undesirable phenomenon which is not peculiar to ion-implanted devices such as just described but which is characteristic of almost all dielectric surface-protected devices is the detrimental effect on device characteristics due to the presence of mobile positive ions in the dielectric. This has been found to occur no matter how extensive the precautions for cleanliness and purity may be during the formation of the dielectric.

It is therefore an object of the present invention to provide an improved method for treating dielectric coated semiconductor bodies.

Another object of the invention is to provide an improved method for preventing deleterious charging of dielectric coatings and the like on semiconductor bodies.

Still another object of the invention is to provide an improved method for negating or inhibiting the deleterious effects of positively charged ions or the like in or on dielectric coatings on semiconductor bodies.

Yet another object of the invention is to provide an improved method for fabricating insulated-gate semiconductor devices by ion implantation.

These and other objects and advantages of the invention are realized by irradiating the surface of dielectric-coated semiconductor bodies with relatively low energy electrons to establish a small negative potential on the irradiated dielectric surface. Thus, during ion implantation the positive charging effect of the ions on the dielectric surface is cancelled or offset by the electrons likewise impinging on this surface so that the aforementioned electric fields, which result in dielectric breakdown or rupture, cannot be built up providing the density of the electrons which impinge on the dielectric surface is equal to or greater than the density of the positive ions likewise impinging on the dielectric surface. Likewise the same advantage may be achieved with respect to the metallic gate member where it is used as a mask during ion implantation. It has also been found possible to overcome the deleterious effects of mobile positive ions associated with as by being present in or on dielectric coatings on semiconductor bodies by irradiating the surface of such dielectric coatings with low energy electrons. In this latter instance the mobile positive ions are pulled or caused to drift to the dielectric surface by the negative charging effect of the electrons. This drifting mechanism of the positive ions may be enhanced by maintaining the dielectric coating at an elevated temperature of from about 200° C. to about 400° C., for example. A portion of the surface of the dielectric containing such drifted positive ions may then be removed.

The invention will be described in greater detail by reference to the drawings in which.

Figure 1:
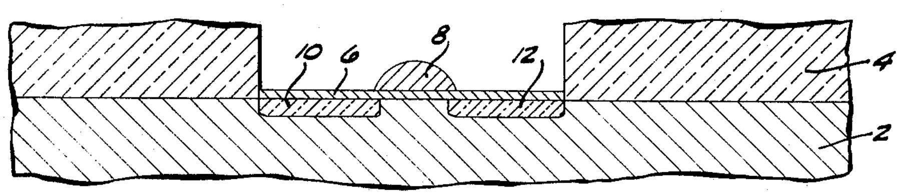
FIGURE 1 is a cross-sectional elevational view of a portion of an insulated-gate field effect device which may be advantageously treated according to the method of the invention.

Referring now to FIGURE 1 a portion of an insulated gate field-effect device is shown which exemplarily includes a semiconductor body 2 of N-type silicon. Disposed on the surface of the silicon body 2 is a layer 4 of dielectric material which typically may be silicon oxide or silicon nitride and which is thick enough to prevent the penetration therethrough of ions impinging on the surface thereof in accordance with criteria set forth in my aforementioned copending application. As shown, an opening is provided through the dielectric coating 4 so as to initially expose a portion of the surface of the semiconductor body 2 which surface portion is then provided with a thin layer 6 of dielectric material which may also be of silicon oxide, for example. The purpose of this thin dielectric layer 6 is to permit the metallic gate electrode member 8 to be disposed thereon and electrically isolated from the underlying semiconductor body 2. The thin dielectric layer 6 should be such as to permit penetration therethrough of ions impinging thereon again in accordance with the teachings of my previously-identified copending application. The gate electrode member 8 may be formed by vapor-deposition of a suitable metal such as aluminum, for example, using conventional masking techniques.

Source and drain regions 10 and 12 of P-type conductivity are formed on either side of the gate member 8 by ion implantation with the gate acting as a mask or barrier against implantation in the portions of the semiconductor body 2 under the gate. As taught in my aforementioned copending application the surface of the semiconductor body on which gate member 8 is disposed is subjected to impingement by a beam of ions capable of establishing the desired type of conductivity. In the instant case where the semiconductor body is of N-type conductivity, ions of a P-type or acceptor impurity may be utilized. A typical acceptor impurity for this purpose is boron.

During this ion implantation process some positively charged ions will remain on or near the surface of both the gate member 8 and the dielectric layer 6. The result is a gradual build-up of a positive potential on these elements (the gate member and the dielectric layer), which eventually not only begins to interfere with the continued desired ion implantation process as by tending to repel or disperse newly arriving positive ions but also tends to cause the dielectric material, including that under the gate member 8, to eventually break down and rupture, whereby it loses its useful electrical insulating and isolating characteristics.

According to the present invention such a potential build-up may be prevented or rendered substantially ineffectual by irradiating the surfaces being impinged by the positively charged ions with relatively low energy electrons. The result of depositing these electrons on these surfaces is to overcome or otherwise cancel the positive-charging effect of the positive ions, it being merely necessary to insure that the number or density of the impinging electrons is equal to or exceeds the number or density of impinging positive ions. The gate member 8, as well as the dielectric surface, will acquire a small negative potential with respect to the semiconductor substrate approximately equal to the potential of the electron source which enhances the integrity of the dielectric layer thereunder by preventing the build-up of a potential across the dielectric which exceeds the dielectric strength thereof.

The irradiating electron beam should be of low energy in order that the dielectric layer or other elements of the device which may be subjected to electron irradiation will not be damaged thereby. A suitably satisfactory range of electron energies which may be employed according to the practice of the invention is from about 4 to about 40 volts. Typically, when implanting with ion beam energies of less than 100 kv. an electron beam energy of about 4 volts has been found suitable. The minimum energy value is determined by that electron energy which is at least high enough to permit the construction and operation of a practical electron source (that is, a source or gun from which electrons may be extracted and focused). The maximum energy value is determined by the dielectric breakdown value of the insulator material since the dielectric surface being irradiated will charge to the potential of the electron source. This maximum electron energy has been found to be about 40 volts for most dielectrics of interest.

It is also important to avoid allowing the electrons to strike the dielectric surface with an energy greater than that at which secondary electron emission from the dielectric surface equals or exceeds the number of primary electrons impinging thereon. This energy is generally referred to as the secondary electron emission cross-over point which simply means the point at which secondary electron emission is equal to or greater than unity. If this precaution is not observed the surface of the dielectric will charge positively due to secondary electron emission. Assuming, for example, that the secondary electron emission cross-over point for a given dielectric has a value of 25 electron-volts and one wants to utilize electrons having an energy of 40 volts, the voltage of the electron source or gun must be slowly raised from its minimum value to the maximum value so as to allow the dielectric surface to follow or charge along with the increasing potential of the electron source whereby the difference between the potential of the electron source and the dielectric surface does not at any time exceed 25 electron-volts. Hence, when the electron source is at 40 volts, the dielectric is likewise at or just slightly less than 40 volts.

Figure 2:
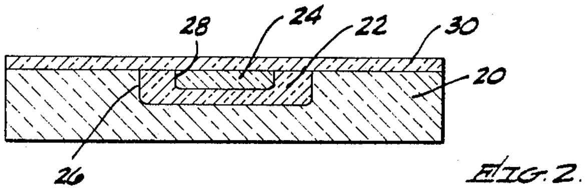
FIG. 2 is a cross-sectional elevational view of an oxide-protected planar diffused transistor which likewise may be advantageously treated according to the invention.

It is also possible according to the present invention to utilize electron beam irradiation to advantage with respect to any semiconductor device having a dielectric surface such as conventional planar diffused diodes and transistors wherein the rectifying junctions are protected by an oxide layer or the like. Such a device is shown in FIG. 2, for example, comprising a silicon body 20 of N-type conductivity in which a base region 22 of P-type conductivity is formed at one surface by conventional diffusion techniques and in which base region an emitter region 24 is also formed at the same surface, likewise by diffusion. The P-N junctions 26 and 28 extend to a common surface and are protected by a layer of silicon oxide 30, for example, which may have also been used as a mask against diffusion during fabrication of the device. This oxide mask and protective layer 30 is conventionally left permanently in place. It has been noted that despite the customary precautions taken to insure fabricating such devices under non-contaminating conditions, some impurities apparently are introduced into the oxide layer which later make their presence known by the adverse effect they exert either on the electrical characteristics of the deivce or on the protective and/or insulating properties of the dielectric layer. These adverse effects often do not show up until the device has been completely fabricated which means that the yield of satisfactory devices is often lower than that anticipated as economically acceptable. While it is not known precisely how the dielectric layer becomes contaminated with unwanted impurities, it will be appreciated that this may happen when one considers that the usual method for forming a dielectric layer of silicon oxide, for example, involves subjecting the surface of a silicon body to steam or water at elevated temperatures. At any rate it has been noted that the dielectric often contains mobile positive ions which tend to congregate at the interface between the semiconductor body and the dielectric layer where they are able to exert maximum unwanted effects.

It has therefore been found feasible to irradiate the dielectric-coated surface of such devices with a low-energy electron beam while maintaining the dielectric layer at a temperature of at least 200° C. and around 350° C., for example. The charging effect of the electron irradiation in combination with the elevated temperature of the dielectric permits or causes the mobile positive ions in the dielectric to drift to the surface of the dielectric layer and away from the interface of the dielectric layer and the semiconductor body. Where this method is used in connection with the metal gate field effect transistor devices described previously, the positive ions tend to drift to the gate member and to collect particularly at the interface between the gate and the dielectric layer which insulates the gate from the semiconductor body. At this interface the positive ions are least able to detrimentally affect device characteristics. It is also possible to remove, as by chemically etching, exposed surface and near-surface portions of the dielectric where the mobile ions have drifted in accordance with the practice of the present invention so as to be rid of the undesirable ions altogther. A suitable etchant for this purpose may be hydrofluoric acid, particularly where the dielectric layer is an oxide of silicon. If the chemical etching treatment is to be employed, it may be desired to anticipate the thickness of the surface to be removed and form the initial dielectric layer thick enough to accommodate this removal.

Another technique for purifying or otherwise negating the adverse effect of positive ions in the dielectric layer is to use the process of ion implantation to implant substances known to be particularly effective for "gettering" alkali ions such as sodium, potassium and lithium, which are often or usually present in dielectric materials. Thus, one may implant an alkali-gettering substance such as phosphorous or aluminum into the surface of the dielectric layer. In the case of an insulated gate field effect transistor device, this may also be performed on the dielectric or oxide which will serve to insulate the gate from the semiconductor body prior to forming the gate thereon. After implanting the gettering substance, the surface is then irradiated with electrons again of low energy which will cause the alkali ions to drift to the surface of the dielectric layer where they react with the gettering substance and become frozen or fixed into a position near the dielectric surface or near the interface between the gate and the dielectric in the case of field effect transistors. These alkali ions will then remain fixed in this position over storage and operating temperatures as well as bias conditions which may be imposed on the device.

It is also possible to simultaneously irradiate the surface of the dielectric layer with low energy electrons while sputtering this surface with an inert ion species such as argon, for example. The unwanted ions, such as the alkali metal ions are caused to drift to the surface of the dielectric or oxide by the negative charging effect of the electron beam irradiation and then the sputtering action of the argon causes their removal. This sputtering action may also result in the removal of some of the dielectric material itself, in which case one might make the dielectric initially somewhat thicker than ultimately desired, in order to compensate for this removal.

Figure 3:
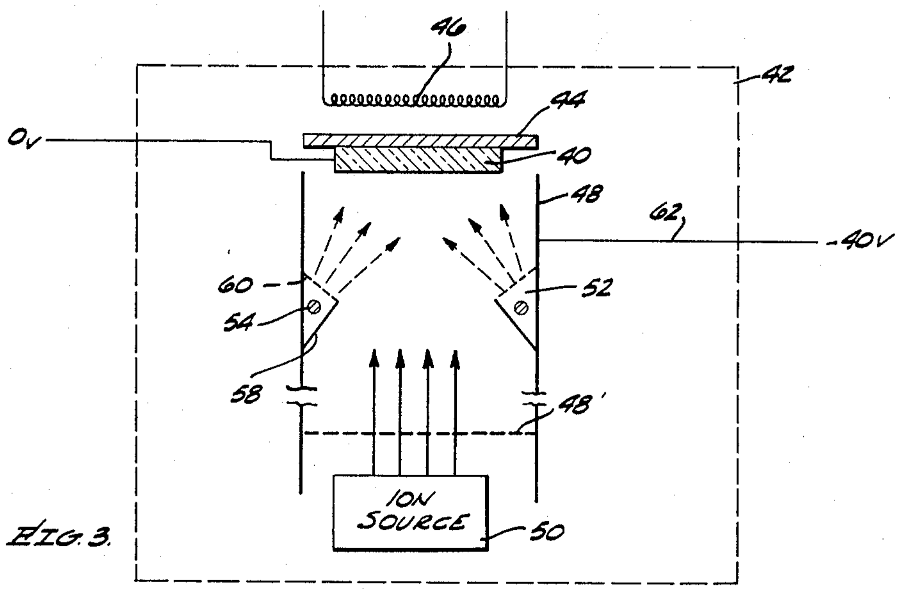
FIG. 3 is a schematic view of apparatus suitable for treating semiconductor bodies and/or devices according to the method of this invention.

Referring now to FIG. 3, a typical apparatus for irradiating a dielectric coated semiconductor specimen 40 according to the method of the present invention is shown. The apparatus is disposed in a vacuum chamber 42 indicated by the dashed line and comprises a specimen holder 44 which may be of metal (i.e., stainless steel) to which the semiconductor specimen 40 is affixed or mounted in some convenient fashion as by clamps or the like (not shown). Adjacent the specimen holder 44 a heating means 46 may be disposed for heating the specimen holder and the semiconductor specimen to any desired temperature. As shown, the specimen holder 44 and the specimen may be disposed over the open upper end of a cylindrical member 48 which may be of stainless steel, for example, and which may have either an open or perforated bottom 48′. Disposed beneath the bottom of the cylindrical member 48 is an ion source 50. This ion source may be typically of the type shown and described in any aforementioned copending application. It will be appreciated that ions generated by the ion source will be directed into the interior of the cylindrical member 48 through the open or perforated bottom end 48′ thereof so as to emerge from the top and impinge on the semiconductor specimen 40 which is positioned over the upper open end of the cylindrical member 48.

Disposed within the cylindrical member 48 and mounted on the inside surface thereof is an electron beam forming source 52. This electron beam forming source may comprise an annular electron emissive member or cathode 54 which may be directly heated by passing a current therethrough to cause the emission of electrons therefrom, as is well-known in the art of vacuum tubes, for example. Alternatively, the cathode member 54 may be indirectly heated as by a heating element (not shown) for the same purpose. The electron emissive source 54 may be provided with an annular metallic sheet (58) of stainless steel, for example, which extends somewhat inwardly toward the interior of the cylindrical member 48 so as to shield the electron source from ions entering the bottom end of the cylindrical container 48. A mesh or grid member 60 may be mounted between the upright wall of the cylindrical member 48 and the upper end of the shielding plate 58. This grid permits modulation of the intensity of the electron beam being formed from the cathode 54. The electron beam source 52 is arranged that the electrons emitted therefrom will also be directed toward the surface of the semiconductor specimen 40 so as to impinge thereon. By a connection 62 the cathode of the electron beam forming source 52 may be maintained at a potential of 40 volts negative with respect to ground and the semiconductor specimen 40 may be maintained at ground potential so that the potential difference between the electron beam source 52 and the semiconductor specimen is about 40 volts. Since the semiconductor specimen 40 is at ground potential and the cathode of the electron emitting source 53 is at a minus 40 volts, the semiconductor specimen 40 is at a positive potential with respect to the electron emitting source. Hence, electrons emitted from the source 54 will be drawn to the semiconductor specimen 40 at an energy level of about 40 volts. This apparatus thus makes it possible to irradiate a semiconductor specimen 40 which may be any of the dielectric coated semiconductor devices described previously which it is desired to process according to the method of the present invention.

There thus has been shown and described a method for treating dielectric coated semiconductor bodies which not only may be utilized to prevent deleterious charging of the dielectric coating in an ion implantation process, but which may also be used to advantage to inhibit or reduce the detrimental effects of positively charged ions or the like which may exist in the dielectric coating on any semiconductor device.

What is claimed is:

1. The method of treating a semiconductor body having a dielectric coating thereon so as to negate the deleterious effects of positively-charged ions associated with said dielectric coating comprising: irradiating a surface of said dielectric coating with low energy electrons to thereby establish a negative potential on said surface at least lower than the dielectric breakdown potential of said dielectric coating.

2. The method of fabricating a semiconductor device including a semiconductor body having a dielectric coating thereon comprising:

(a) implanting positively-charged ions of a conductivity-type-determining impurity in preselected portions of said semiconductor body through said dielectric coating thereon;

(b) and irradiating the surface of said dielectric coating through which said ions are implanted with low energy electrons to thereby establish a negative potential on said surface at least lower than the dielectric breakdown potential of said dielectric coating.

3. The method according to claim 2 wherein said dielectric coating is irradiated with said electrons simultaneously with the implanting of said positively-charged ions.

4. The method of treating a semiconductor body having a dielectric coating thereon so as to negate the deleterious effect of positively-charged ions associated with said dielectric coating comprising the steps of:

(a) irradiating a surface of said dielectric coating with low energy electrons to thereby establish a negative potential on said surface at least lower than the dielectric breakdown potential of said dielectric coating whereby positively-charged ions in said dielectric coating are caused to drift to surface and near-surface portions of said dielectric coating;

(b) and removing said surface and near-surface portions of said dielectric coating.

5. The method according to claim 4 wherein said dielectric coating is maintained at a temperature of at least 200° C. during said irradiation.

6. The method of treating a semiconductor body having a dielectric coating thereon so as to negate the deleterious effects of positively-charged ions associated with said dielectric coating comprising: irradiating a surface of said dielectric coating with low energy electrons to thereby establish a negative potential on said surface at least lower than the dielectric breakdown potential of said dielectric coating while maintaining said coating at a temperature of at least 200° C. whereby said positively-charged ions in said dielectric coating are caused to drift to surface and near-surface portions of said coating.

7. The method of treating a semiconductor body having a dielectric coating thereon so as to negate the deleterious effect of positively-charged ions associated with said dielectric coating comprising the steps of:

(a) incorporating a positive-ion gettering substance in portions of said dielectric coating;

(b) and irradiating a surface of said dielectric coating with low energy electrons to thereby establish a negative potential on said surface at least lower than the dielectric breakdown potential of said dielectric coating whereby said positively-charged ions are caused to drift into said portions of said dielectric coating containing said gettering substance.

8. The method according to claim 7 wherein said dielectric coating is maintained at a temperature of at least 200° C. during said irradiation.

9. The method of treating a semiconductor body having a dielectric coating thereon so as to negate the deleterious effect of positively-charged ions associated with said dielectric coating comprising the steps of:

(a) irradiating a surface of said dielectric coating with low energy electrons to thereby establish a negative potential on said surface at least lower than the dielectric breakdown potential of said dielectric coating to cause said positively-charged ions to drift to surface and near-surface portions of said dielectric coating;

(b) and bombarding the surface of said dielectric coating with inert ions whereby said surface and near-surface portions are removed by the sputtering action of said inert ions.

10. The method according to claim 9 wherein said dielectric coating is maintained at a temperature of at least 200° C. during said irradiation.

References Cited

UNITED STATES PATENTS

| | | | |
|---|---|---|---|
| 3,341,754 | 9/1967 | Kellett et al. | 317—234 |
| 3,388,009 | 6/1968 | King | 148—1.5 |
| 3,390,019 | 6/1968 | Manchester | 148—1.5 |
| 3,413,531 | 11/1968 | Leith | 317—235 |

L. DEWAYNE RUTLEDGE, Primary Examiner

E. L. WEISE, Assistant Examiner

U.S. Cl. X.R.

29—576; 148—187